(12) United States Patent
Shigeno et al.

(10) Patent No.: US 7,823,470 B2
(45) Date of Patent: Nov. 2, 2010

(54) CANTILEVER AND CANTILEVER MANUFACTURING METHOD

(75) Inventors: Masatsugu Shigeno, Chiba (JP); Osamu Matsuzawa, Chiba (JP); Naoya Watanabe, Chiba (JP); Amiko Nihei, Chiba (JP); Akira Inoue, Chiba (JP); Yoshiharu Shirakawabe, Chiba (JP); Hiroshi Muramatsu, Tokyo (JP); Yuji Yamamoto, Hachioji (JP)

(73) Assignee: Seiko Instruments Inc. (JP)

( * ) Notice: Subject to any disclaimer, the term of this patent is extended or adjusted under 35 U.S.C. 154(b) by 757 days.

(21) Appl. No.: 11/709,495

(22) Filed: Feb. 22, 2007

(65) Prior Publication Data

US 2007/0214875 A1   Sep. 20, 2007

(30) Foreign Application Priority Data

Mar. 16, 2006  (JP)  ............... 2006-072673

(51) Int. Cl.
*G01Q 70/00* (2010.01)
*G01Q 70/10* (2010.01)
*G01B 21/30* (2006.01)

(52) U.S. Cl. ............... 73/866.5; 73/105; 850/52; 850/57

(58) Field of Classification Search ............... 73/105, 73/866.5; 850/52–53, 56–57
See application file for complete search history.

(56) References Cited

U.S. PATENT DOCUMENTS

| | | | |
|---|---|---|---|
| 5,976,390 A * | 11/1999 | Muramatsu | 216/2 |
| 5,994,152 A * | 11/1999 | Khandros et al. | 438/617 |
| 6,291,140 B1 * | 9/2001 | Andreoli et al. | 430/322 |
| 6,864,481 B2 * | 3/2005 | Kaito et al. | 250/306 |
| 7,042,216 B2 * | 5/2006 | Barbic | 324/307 |
| 7,055,378 B2 * | 6/2006 | Su et al. | 73/105 |
| 7,218,600 B2 * | 5/2007 | Cho et al. | 369/126 |
| 7,375,321 B2 * | 5/2008 | Roukes et al. | 250/306 |
| 7,584,653 B2 * | 9/2009 | Su et al. | 73/105 |
| 2002/0021139 A1* | 2/2002 | Jackson | 324/762 |
| 2006/0163767 A1* | 7/2006 | van der Weide et al. | 264/102 |

FOREIGN PATENT DOCUMENTS

| | | | |
|---|---|---|---|
| JP | 10073608 A | * | 3/1998 |
| JP | 10170530 | | 6/1998 |
| JP | 2000329676 A | * | 11/2000 |
| JP | 2002062253 | | 2/2002 |
| JP | 2003156425 A | * | 5/2003 |
| KR | 2005120024 A | * | 12/2005 |

* cited by examiner

Primary Examiner—Thomas P Noland
(74) Attorney, Agent, or Firm—Adams & Wilks

(57) ABSTRACT

A cantilever includes: a lever portion; a holder portion supporting the proximal end of the lever portion; a probe portion arranged at the distal end of the lever portion and having a spherical surface to face a sample; and a retaining portion fixed to the distal end of the lever portion and retaining the probe portion to surround a periphery of the probe portion. There is provided a cantilever allowing mounting of a probe portion with little effect in a short time without using any adhesive.

7 Claims, 13 Drawing Sheets

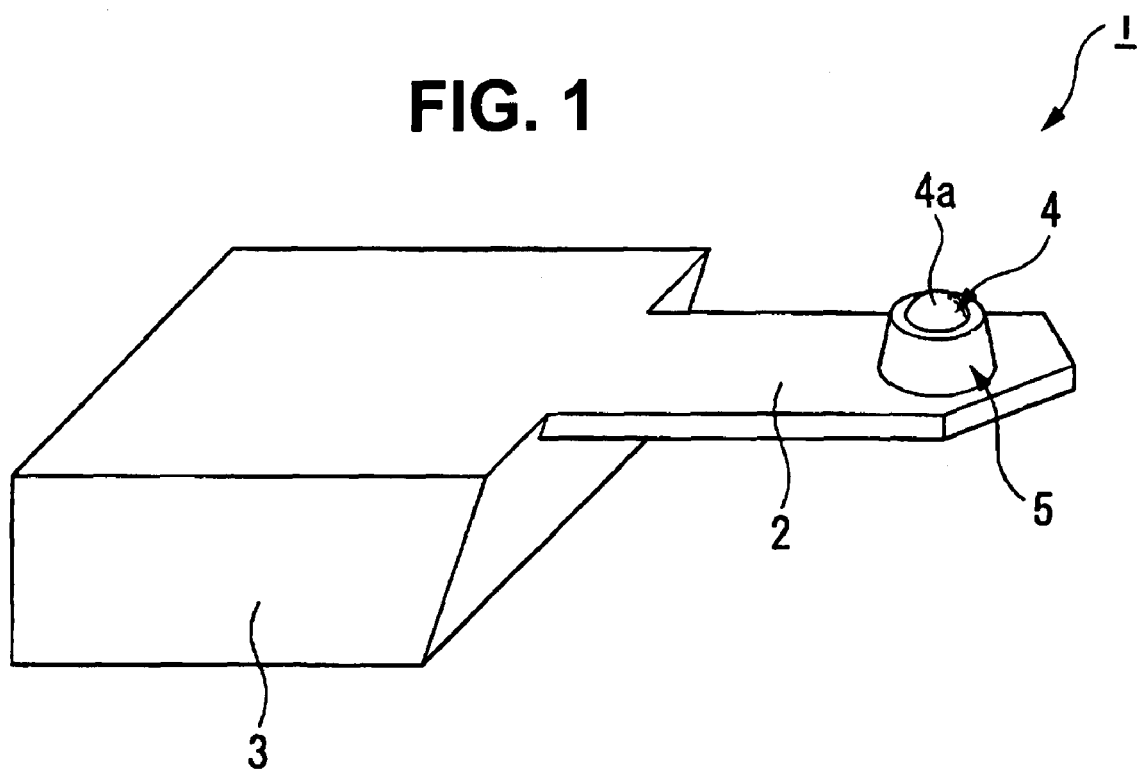
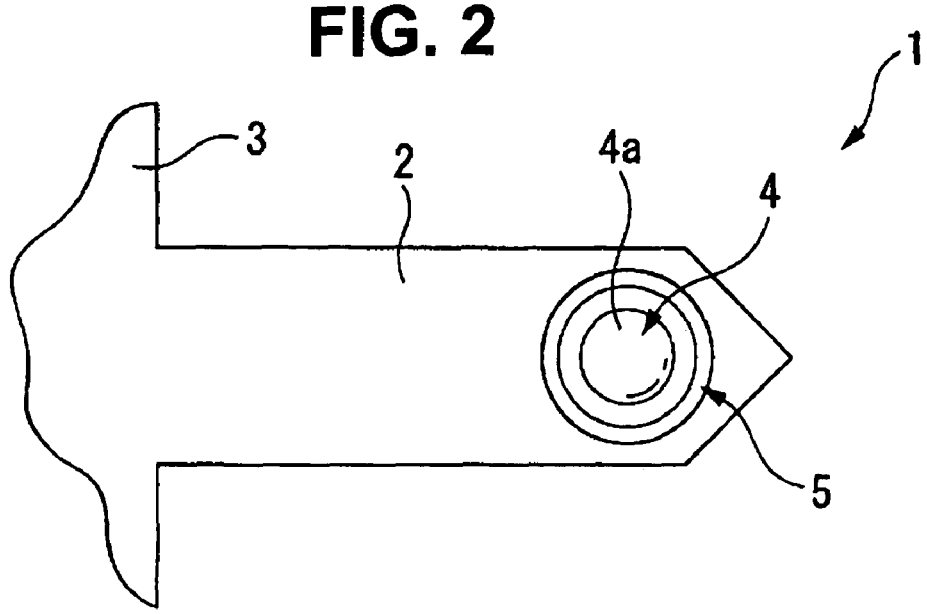

H<D

H=D

H<D

H>D

URGING

CANTILEVER AND CANTILEVER MANUFACTURING METHOD

BACKGROUND OF THE INVENTION

1. Field of the Invention

The present invention relates to a cantilever allowing observation of physical properties of samples, and to a method of manufacturing the cantilever.

2. Description of the Related Art

A cantilever for an ordinary scanning probe microscope (SPM) is mounted through semiconductor crystal etching or the like. The maximum value of a distal end diameter of a probe of a cantilever is usually specified in specifications, whereas the minimum value thereof is not particularly specified, that is, it is not a known value. This is because there is a demand for a probe as thin as possible. Thus, with the current state of the art, when the probe is brought into contact with the sample, it is rather difficult to keep the contact area therebetween at a known value.

When measuring physical properties of a surface of a sample, for example, viscoelasticity or the like of the sample surface, by using a cantilever, in order to perform accurate measurement, it is desirable that a contact area between the sample and the probe be a known value and that the measurement be conducted under a fixed pressure while controlling the pushing force. That is, the deformation amount of the sample is a value proportional to the pressure, so, if the measurement is conducted with solely the force set, it is rather difficult to meet the above-mentioned requirement with a cantilever with an ordinary probe as described above.

In this connection, a cantilever is known which adopts a spherical configuration of a specified diameter (see, for example, JP 2002-62253 A and JP 10-170530 A). Generally speaking, in manufacturing a cantilever of this type, there is adopted a method in which a spherical body is fixed to a distal end of a conventional probe by adhesive or the like or a method in which a spherical body is fixed to a distal end of a flat lever portion by adhesive or the like and is used as a probe.

In the cantilever, which has a spherical probe of a predetermined diameter, it is possible for the contact area between the probe and the sample to be a know value. Thus, it is possible to accurately measure physical property, such as viscoelasticity.

However, in manufacturing the conventional cantilever described above, the following problems are still involved.

That is, when bonding the spherical body to the distal end of a pointed probe or to the distal end of a flat lever portion, an operator usually conducts a bonding operation by using a manipulator while checking parts to be bonded. Thus, the operation is rather difficult to perform and requires experience, which means it is not to be easily performed just by anybody; the operation can only be performed by a skilled operator.

In particular, when bonding the spherical body, setting of a position of the spherical body is difficult to perform. Further, it is necessary to apply a predetermined amount of adhesive solely to a predetermined position, such as the distal end of a probe or the distal end of a lever portion, so the operation is difficult to perform even for a skilled operator.

Further, the above-mentioned method only allows handling of a spherical body of a size allowing observation with an optical microscope, so a further reduction in the contact area between the probe and the sample is impossible. Further, the fact that the spherical body has to be manipulated by a manipulator also makes it necessary for the spherical body to be of a size not smaller than a fixed level so that it can be handled properly, which means handling of a minute spherical body is impossible.

Further, after application of adhesive, the operator must quickly mount the spherical body before the adhesive is cured. That is, the operator is compelled to quickly perform a delicate and precise mounting operation. This restriction in terms of time also makes the mounting operation difficult to perform.

Further, even when the mounting operation is conducted by a skilled operator, it can happen that the adhesive is applied in excess, resulting in a surface of the spherical body being excessively covered with a part of the adhesive. Thus, there is a fear of a change in the contact area between the probe and the sample, that is, a fear of a deterioration in product quality.

Further, in some cases, when using a cantilever, the spherical body is previously modified with some substance according to the use. In the conventional method, which requires a number of steps for the mounting operation, if the modification is effected on the spherical body-prior to the adhesion, the modified portion will be damaged or affected by the adhesive. In view of this, instead of performing the modification on the spherical body beforehand, there is nothing for it but to modify the spherical body together with the cantilever after it has been mounted to the cantilever. However, when the modification is performed on the spherical body together with the cantilever, there is a fear of the cantilever being adversely affected; thus, there are limitations in terms, for example, of the kind of substance to be used for modification, thus making the handling of the spherical body and the cantilever rather difficult. Further, this also leads to a deterioration in terms of a degree of freedom in design.

SUMMARY OF THE INVENTION

The present invention has been made in view of the above problems in the prior art. It is a principal object of the present invention to provide a cantilever and a cantilever manufacturing method allowing mounting of a probe portion formed of a spherical body or the like in a short time without using any adhesive.

Another object of the present invention is to provide a cantilever and a cantilever manufacturing method allowing mounting even of a minute probe portion difficult to observe with an optical microscope and modification without being restricted in terms of a modification substance, thus helping to achieve an improvement in terms of a degree of freedom in design.

To achieve the above-mentioned objects, the present invention provides the following means.

According to the present invention, there is provided a cantilever, characterized by including: a lever portion with spring property, which has an opposing surface facing a sample and extends in one direction from a proximal end to a distal end; a holder portion supporting the proximal end of the lever portion in an overhanging manner; a probe portion which is capable of coming into contact with the sample while arranged at the distal end of the lever portion and at least whose opposing surface facing the sample is formed in a spherical configuration of a predetermined radius; and a retaining portion whose one end is fixed to the distal end of the lever portion and which retains the probe portion with the opposing surface exposed, the cantilever being characterized in that the retaining portion has on an inner side thereof a contact surface held in contact with an outer surface of the probe portion while arranged to surround a periphery of the probe portion, and that the probe portion is retained by a chemical binding force directly exerted between the contact surface and the outer surface.

Further, according to the present invention, there is provided a method of manufacturing a cantilever equipped with: a lever portion with spring property, which has an opposing surface facing a sample and extends in one direction from a proximal end to a distal end; a holder portion supporting the proximal end of the lever portion in an overhanging manner; a probe portion which is capable of coming into contact with the sample while arranged at the distal end of the lever portion and at least whose opposing surface facing the sample is formed in a spherical configuration of a predetermined radius; and a retaining portion whose one end is fixed to the distal end of the lever portion and which retains the probe portion with the opposing surface exposed, the method being characterized by including: an immersing step in which, after being integrally formed, the holder portion and the lever portion are immersed in a photo-setting resin for stereo lithography; a stereo lithography step in which, after the immersing step, a laser beam is applied to the distal end of the lever portion to locally cure a portion of the photo-setting resin situated at a focus of the laser beam, and in which the laser beam is moved so that a focal position is moved along a desired three-dimensional pattern to successively cure the photo-setting resin to thereby prepare the retaining portion by stereo lithography so that the retaining portion exhibits on an inner side thereof a contact surface held in contact with an outer surface of the probe portion while arranged to surround a periphery of the probe portion; a setting step in which, after the stereo lithography step, the lever portion with one end of the retaining portion fixed thereto and the holder portion are extracted from the photo-setting resin and in which another end of the retaining portion is situated at a position over the probe portion; and a retaining step in which, after the setting step, the probe portion is forced into the retaining portion from the another end of the retaining portion so that the opposing surface is exposed to a side of the sample, and in which the probe portion is retained by a chemical binding force directly exerted between the outer surface of the probe portion and the contact surface of the retaining portion.

In the cantilever and the cantilever manufacturing method according to the present invention, the holder portion and the lever portion are first integrally formed of silicon or the like, and then, there is performed an immersion step, in which the holder portion and the lever portion are immersed in a photo-setting resin for stereo lithography. Then, a laser beam is applied to the distal end of the lever portion, whereby the portion of the photo-setting resin situated at the focus of the laser beam starts to be locally cured. In this case, the laser beam is moved such that the focal position moves along the three-dimensional pattern of a desired retaining portion. As a result, the photo-setting resin is cured successively for shaping along a locus of the focal position. By this stereo lithography step, it is possible to prepare a retaining portion whose one end is fixed to the distal end of the lever portion. More specifically, the retaining portion is formed so as to surround the periphery of the probe portion and to have on the inner surface thereof a contact surface to be brought into contact with the outer surface of the probe portion.

Then, the lever portion with the retaining portion formed at the distal end thereof and the retaining portion are extracted from the photo-setting resin. The setting step is then performed, in which the other end of the retaining portion is positioned on the probe portion. Next, the lever portion and the probe portion are caused to make relative movement so as to approach each other, forcing the probe portion into the retaining portion at the other end thereof. By this retaining step, the outer surface of the probe portion and the contact surface are directly brought into intimate face contact with each other. Thanks to the chemical binding force at the time of this intimate contact, that is, the surface attraction force, the retaining portion can retain the probe portion. Further, since the retaining portion is arranged so as to surround the periphery of the probe portion, the retaining portion can retain the probe portion firmly through multi-point grasping.

On the other hand, in the retained probe portion, a spherical opposing surface of a predetermined radius is exposed from the retaining portion so as to be opposed to the sample. Thus, it is possible to keep the contact area between the probe and the sample at a known value, making it possible to accurately observe information on the physical property of the sample, such as viscoelasticity and frictional force.

In particular, since the probe portion is forced into the retaining portion, and the probe portion is retained by the surface attraction force, which is a chemical binding force directly acting between the outer surface of the probe portion and the contact surface, there is no need to use adhesive as in the prior art. Thus, there is no need to apply adhesive with pinpoint accuracy to a predetermined position at the distal end of the lever portion, nor is it necessary to quickly bond the probe portion in consideration of the curing time of the adhesive. Thus, the mounting operation ceases to be one requiring skilled labor as in the prior art, making it possible to achieve a reduction in the requisite time and effort on the part of the operator and a reduction in operation time.

Further, since the probe portion is forced into the retaining portion whose one end is fixed to the lever portion, it is possible to retain the probe portion reliably at the correct position. In the prior art, adhesion is effected the instant the spherical body comes into contact with the region where adhesive is applied. Thus, it is necessary to apply a predetermined amount of adhesive exclusively to an intended position, and to accurately manipulate the spherical body at that position.

In contrast, as stated above, in the cantilever of the present invention, the probe portion is forced into the retaining portion fixed to the lever portion, making it possible to effect retention without using any adhesive; thus, it is possible to retain the probe portion accurately at the intended position. This also helps to facilitate the operation for the operator and to achieve an improvement in product quality.

Further, since no adhesive is used, there is no fear of surplus adhesive reaching the probe portion to cover the surface thereof. Thus, when the opposing surface of the probe portion exposed from the retaining portion comes into contact with the sample, there is no fear of the contact area therebetween being changed. This feature also helps to achieve an improvement in product quality.

Further, since the retaining portion is prepared by stereo lithography, the retaining portion can be prepared easily even in a case where a shape thereof is generally difficult to realize. Thus, the degree of freedom in design is enhanced.

As stated above, according to the cantilever and the cantilever manufacturing method of the present invention, it is possible to mount the probe portion with little effort in a short time without using any adhesive, thereby achieving an improvement in product quality.

Further, the cantilever of the present invention is characterized in that, in the cantilever as described above, the retaining portion is formed as a cylinder at least a part of an inner peripheral surface of which constitutes the contact surface, and the retaining portion has at another end thereof an opening of a size equal to or smaller than a diameter of the probe portion.

Further, a method of manufacturing a cantilever of the present invention is characterized in that, in the method of manufacturing a cantilever as described above, the retaining portion is formed in the stereo lithography step as a cylinder at least a part of an inner peripheral surface of which constitutes the contact surface and the another end of which has an opening whose size is equal to or smaller than a diameter of the probe portion.

In the cantilever and the cantilever manufacturing method of the present invention, the retaining portion is cylindrical, so the contact surface and the outer surface are in contact with each other over the entire periphery of the probe portion. Thus, it is possible to retain the probe portion more reliably.

In this case, in a case in which the size of the opening at the other end is smaller than the diameter of the probe portion, the contact surface exerts a "rebound" action when the probe portion is forced into the retaining portion. Thus, it is possible to retain the retaining portion more reliably. Even when the size of the opening at the other end is substantially the same as the diameter of the probe portion, the outer surface and the contact surface are directly brought into intimate contact with each other by a surface attraction force, which is a chemical binding force, so it is possible to reliably retain the probe portion. In this case, in particular, there is no need to force in the probe portion with excessive force, so the mounting is easy to perform.

Further, when the opening size is not more than the diameter of the probe portion, it is possible to obtain, in addition to the above-mentioned surface attraction force, which is a chemical binding force, a binding force due to physical fit-engagement. This also helps to enhance the reliability in retention. Even when physical fit-engagement is not to be expected (for example, when the opening size is larger than the diameter of the probe portion), there is no problem since the chemical binding force is exerted.

Further, a method of manufacturing a cantilever of the present invention is characterized in that, in the cantilever as described above, at least one of the retaining portion and the lever portion is provided with a communication hole formed therein for establishing communication between an interior and an exterior of the cylinder and allowing a compressed inner fluid to be discharged to the exterior when the probe portion is inserted.

Further, in the method of manufacturing a cantilever as described above, a method of manufacturing a cantilever of the present invention is characterized in that, in the stereo lithography step, at least one of the retaining portion and the lever portion is provided with a communication hole formed therein for establishing communication between an interior and an exterior of the cylinder and allowing a compressed inner fluid to be discharged to the exterior when the probe portion is inserted.

In the cantilever and the cantilever manufacturing method of the present invention, a communication hole is formed in at leas one of the retaining portion and the lever portion during the stereo lithography step, so, when forcing in the probe portion for fixation, it is possible, through the entry of the probe portion, to discharge to the exterior the fluid, such as air and solution, compressed in the retaining portion. Thus, the probe portion can be easily forced into the retaining portion, thereby achieving an improvement in operational efficiency.

Further, a cantilever of the present invention is characterized in that, in the cantilever as described above, the retaining portion has a plurality of slits formed in a circumferential direction.

Further, in the method of manufacturing a cantilever as described above, a method of manufacturing a cantilever of the present invention is characterized in that, in the stereo lithography step, the retaining portion is prepared so that a plurality of slits are exhibited to be arranged in a circumferential direction.

In the cantilever and the cantilever manufacturing method of the present invention, a plurality of slits are formed in the circumferential direction, so the retaining portion can be easily expanded and contracted radially. That is, the retaining portion easily undergoes an increase or a decrease in diameter. Thus, the probe portion can be easily forced into the retaining portion, thereby achieving an improvement in operational efficiency.

Further, a cantilever of the present invention is characterized in that, in any one of the cantilevers as described above, at least a part of the retaining portion is formed of a shape-memory material and is expanded and contracted by an external factor, and the size of the opening at the another end of the retaining portion is changed to become larger than the diameter of the probe portion as the retaining portion undergoes expansion and contraction to thereby make the probe portion detachable.

Further, a method of manufacturing a cantilever of the present invention is characterized in that, in any one of the methods of manufacturing a cantilever as described above, a shape-memory material is used as the photo-setting resin, and at least a part of the retaining portion is caused to undergo expansion and contraction by an external factor and to effect a change with the expansion and contraction so that the size of the opening at the another end of the retaining portion is made larger than the diameter of the probe portion to thereby make the probe portion detachable.

In the cantilever and the cantilever manufacturing method of the present invention, at least a part of the retaining portion is formed of a shape-memory material (e.g., shape-memory metal or polymer), and undergoes expansion and contraction under an influence of an external factor, such as heat, electric field, or magnetic field. Further, with this expansion and contraction, the size of the opening at the other end of the retaining portion is changed to become larger than the diameter of the probe portion. As a result, the probe portion can be made detachable with respect to the retaining portion. Thus, it is possible to replace solely the probe portion upon secular changes, etc. Thus, it is possible to minimize the number of components to be replaced, thereby achieving a reduction in running cost.

Further, when the probe portion is brought into contact with the sample, it is possible to cause some object to be measured (e.g., DNA) to adhere to the probe portion, and detach the probe portion with the object to be measured adhering thereto, sending the object to be measured together with the probe portion to places where other inspection, observation, etc. are to be performed.

Further, a cantilever of the present invention is characterized in that, in the cantilever as described above, the retaining portion is formed of a plurality of claw portions surrounding the periphery of the probe portion at predetermined intervals and each having a contact surface.

Further, a method of manufacturing a cantilever of the present invention is characterized in that, in the method of manufacturing a cantilever as described above, in the stereo lithography step, the retaining portion is formed as a plurality of claw portions surrounding the periphery of the probe portion at predetermined intervals and each having the contact surface.

In the cantilever and the cantilever manufacturing method of the present invention, the retaining portion is formed of a plurality of claw portions arranged at predetermined intervals to surround the periphery of the probe portion (e.g., two claw portions arranged at an interval of 180 degrees, three claw portions arranged at an interval of 120 degrees, or four claw portions arranged at an interval of 90 degrees), so it is possible to reliably surround the periphery of the probe portion and retain the probe portion in an embracing manner. Thus, it is possible to reliably retain the probe portion. The inner surfaces of the claw portions facing the probe portion constitute the contact surface. Through the gaps between the claw portions, it is possible to easily check the way the probe portion is retained.

Further, a cantilever of the present invention is characterized in that, in the cantilever as described above, each of the plurality of claw portions has at another end thereof a hook-like turn-up portion.

Further, a method of manufacturing a cantilever is characterized in that, in the method of manufacturing the cantilever as described above, in the stereo lithography step, a hook-like turn-up portion is formed at the another end of each of the plurality of claw portions.

In the cantilever and the cantilever manufacturing method of the present invention, turn-up portions are formed at the other ends of the plurality of claw portions, so the probe portion retained by the plurality of claw portions in an embracing manner is held in contact with the turn-up portions and does not easily undergo positional deviation. Thus, the probe portion is stabilized in attitude and is not easily detached. As a result, it is possible to retain the probe portion still more reliably.

Further, a cantilever of the present invention is characterized in that, in the cantilever as described above, the plurality of claw portions are previously urged to be deflected toward a center of the probe portion.

Further, a method of manufacturing a cantilever is characterized in that, in the method of manufacturing the cantilever as described above, in the stereo lithography step, the plurality of claw portions are formed in a previously urged state to be deflected toward a center of the probe portion.

In the cantilever and the cantilever manufacturing method of the present invention, a plurality of claw portions are urged beforehand toward the center of the probe portions, so it is possible to augment the surface attraction force, which is a chemical binding force directly exerted between the outer surface of the probe portion and the contact surface, making it possible to retain the probe portion with a stronger force.

Further, a method of manufacturing a cantilever is characterized in that, in any one of the methods of manufacturing a cantilever as described above, the setting step includes: a placing step in which the probe portion is placed on a substrate; and a locating step in which, after the placing step, scanning is performed on the substrate on which the probe portion is placed with the lever portion to perform SPM observation on a surface configuration of the probe portion and to locate a position of the probe portion, and, after the locating step, the another end of the retaining portion is set on the probe portion whose position has been located.

In the cantilever manufacturing method of the present invention, when performing the setting step, the placing step for placing the probe portion on the substrate is first performed. Next, by using the lever portion to the distal end of which the retaining portion is fixed, there is performed the locating step in which scanning is performed on the substrate on which the probe portion is placed to thereby perform. SPM observation, whereby it is possible to check a surface configuration of the probe portion and to clearly locate the position of the probe portion. After that, the other end of the retaining portion is positioned on the located probe portion.

By thus performing SPM observation, even a probe portion of a size not easily allowing observation with a conventional optical microscope can be reliably forced into the retaining portion for fixation. Thus, it is possible to manufacture a cantilever having a smaller probe portion. As a result, it is possible to observe a minute region of the sample with higher resolution.

Further, a method of manufacturing a cantilever is characterized in that, in any one of the methods of manufacturing a cantilever as described above, prior to the setting step, a modifying step is conducted in which the probe portion is previously modified with a predetermined substance.

In the cantilever manufacturing method of the present invention, the modifying step is performed, so it is possible to previously modify the probe portion with various kinds of substance according to the object of sample observation. In particular, as stated above, the probe portion can be fixed without using any adhesive through a simple operation of forcing-in, so there is no fear of the modified portion being flawed or affected by adhesive. Thus, there is no need to perform modification on the probe portion together with the cantilever.

Thus, it is possible to prevent the cantilever from being adversely affected, and to perform modification without being restricted in terms of the substance to be used. As a result, it is possible to perform a more diversified observation, and to achieve an improvement in degree of freedom in cantilever design.

Further, according to the present invention, there is provided a cantilever, characterized by including: a lever portion with spring property, which has an opposing surface facing a sample and extends in one direction from a proximal end to a distal end; a holder portion supporting the proximal end of the lever portion in an overhanging manner; a probe portion which is formed of a magnetic material, which is capable of coming into contact with the sample while arranged at the distal end of the lever portion, and at least whose opposing surface facing the sample is formed in a spherical configuration of a predetermined radius; and an attracting portion provided at the distal end of the lever portion and adapted to attract the probe portion by utilizing a magnetic force.

In the cantilever of the present invention, the probe portion is retained through attraction by utilizing the magnetic force due to the attracting portion, so there is no need to use adhesive as in the prior art. Thus, there is no need to apply adhesive with pinpoint accuracy to a determined position at the distal end of the lever portion, nor is it necessary to quickly bond the probe portion in consideration of the curing time of the adhesive. Thus, the mounting operation ceases to be one requiring skilled labor as in the prior art, making it possible to reduce the time and effort on the part of the operator and to shorten the operation time. Further, since no adhesive is used, there is no fear of surplus adhesive reaching the probe portion to cover the surface thereof. Thus, when the opposing surface of the probe portion comes into contact with the sample, it is possible to prevent a change in the contact area therebetween, making it possible to achieve an improvement in product quality.

As stated above, in the cantilever of the present invention, it is possible to mount the probe portion with little effort in a short time without using any adhesive, thereby achieving an improvement in product quality.

Further, a cantilever of the present invention is characterized in that, in the cantilever as described above, the attracting portion allows detachment of the probe portion through reversal of the polarity of the magnetic force.

In the cantilever of the present invention, the attracting portion reverses the polarity of the magnetic force, thereby making the probe portion detachable with respect to the lever portion. Thus, it is possible to replace solely the probe portion upon secular changes or the like. Thus, it is possible to minimize the number of components to be replaced, thereby achieving a reduction in running cost. Further, when the probe portion is brought into contact with the sample, it is possible to cause some object to be measured (e.g., DNA) to adhere to the probe portion, and to detach the probe portion with the object to be measured adhering thereto, sending the object to be measured to places for other inspections, observations, etc., together with the probe portion.

Further, according to the present invention, there is provided a method of manufacturing a cantilever equipped with a lever portion with spring property, which has an opposing surface facing a sample and extends in one direction from a proximal end to a distal end; a holder portion supporting the proximal end of the lever portion in an overhanging manner; and a probe portion which is capable of coming into contact with the sample while arranged at the distal end of the lever portion and at least whose opposing surface facing the sample is formed in a spherical configuration of a predetermined radius, the method being characterized by including: a placing step in which the probe portion is placed on a substrate after forming the holder portion and the lever portion integrally; a locating step in which, after the placing step, scanning is performed on the substrate on which the probe portion is placed with the lever portion to perform SPM observation on a surface configuration of the probe portion and to locate a position of the probe portion; a setting step in which, after the locating step, the distal end of the lever portion is situated on the probe portion whose position has been located; and a fixing step in which, after the setting step, the probe portion is fixed to a predetermined position at the distal end of the lever portion.

In the cantilever manufacturing method of the present invention, the placing step for placing the probe portion on the substrate is first performed. Next, the locating step is conducted in which scanning is performed on the substrate on which the probe portion is placed to thereby perform SPM observation, whereby it is possible to check the surface configuration of the probe portion and to clearly locate the position of the probe portion. After that, the setting step is performed in which the distal end of the lever portion is positioned on the located probe portion. Then, finally, there is performed the fixing step in which the probe portion is fixed to a predetermined position at the distal end of the set lever portion. As a result, it is possible to fix the probe portion to the distal end of the lever portion, thus making it possible to manufacture a cantilever without using any adhesive.

In particular, since there is no need to use adhesive, there is no need to apply adhesive with pinpoint accuracy to a predetermined position at the distal end of the lever portion, nor is it necessary to quickly bond the probe portion in consideration of the curing time of the adhesive. Thus, the mounting operation ceases to be one requiring skilled labor as in the prior art, making it possible to reduce the time and effort on the part of the operator and to shorten the operation time.

Further, since no adhesive is used, there is no fear of surplus adhesive reaching the probe portion to cover the surface thereof. Thus, when the opposing surface of the probe portion comes into contact with the sample, it is possible to prevent a change in the contact area therebetween, thereby achieving an improvement in product quality.

Further, by performing SPM observation, even a probe portion so small as to be difficult to observe with a conventional optical microscope can be reliably fixed to the lever portion. Thus, it is possible to manufacture a cantilever having a smaller probe portion. As a result, it is possible to perform sample observation with higher accuracy.

Further, a method of manufacturing a cantilever of the present invention is characterized in that, in the method of manufacturing a cantilever as described above, the probe portion is formed of a magnetic material, and in which, in the fixing step, the probe portion is fixed to the lever portion by utilizing a magnetic force.

In the cantilever manufacturing method of the present invention, a magnetic force is utilized, so the probe portion can be fixed in position easily and instantaneously.

Further, a method of manufacturing a cantilever of the present invention is characterized in that, in the method of manufacturing a cantilever as described above, in the fixing step, the lever portion is caused to make an ultrasonic oscillation, and in which the probe portion is fixed in position through heat bonding by utilizing heat generated by the ultrasonic oscillation.

In the cantilever manufacturing method of the present invention, the lever portion is caused to make ultrasonic oscillation, and, utilizing the heat thereby generated, the probe portion is fixed in position through heat bonding, so the probe portion can be fixed in position easily and instantaneously.

Further, a method of manufacturing a cantilever of the present invention is characterized in that, in the method of manufacturing a cantilever as described above, prior to the placing step, there is conducted a modifying step in which the probe portion is previously modified with a predetermined substance.

In the cantilever manufacturing method of the present invention, a modifying step is conducted, so the probe portion can be modified beforehand with various substances according to the object of sample observation. As stated above, the probe portion is fixed without using any adhesive, so there is no fear of the modified portion being flawed or affected by adhesive as in the prior art. Thus, it is not necessary to perform modification on the probe portion together with the cantilever. Thus, it is possible to prevent the cantilever from being adversely affected, and to perform modification without any restriction in terms of the kind of substance used. As a result, it is possible to perform a more diversified observation, and to achieve an improvement in terms of a degree of freedom in cantilever design.

In the cantilever and the cantilever manufacturing method of the present invention, it is possible to mount the probe portion with little effort in a short time without using any adhesive, and to achieve an improvement in product quality. Further, even a probe portion so small as to be difficult to be observed with an optical microscope can be mounted, and modification is possible without involving any restriction in terms of the kind of substance used, thus helping to achieve an improvement in terms of a degree of freedom in design.

BRIEF DESCRIPTION OF THE DRAWINGS

In the accompanying drawings:

FIG. 1 is a perspective view of a cantilever according to a first embodiment of the present invention;

FIG. 2 is a top view of the cantilever shown in FIG. 1;

FIGS. 5A to 5C are diagrams illustrating a process of manufacturing the cantilever shown in FIG. 1, of which FIG. 5A is a diagram showing how SPM observation is conducted while performing scanning with a lever portion on a substrate on which a probe portion is placed, FIG. 5B is a diagram showing how, after the SPM observation of FIG. 5A, the lever portion is moved to a position over the probe portion whose position has been located through the SPM observation, FIG. 5C is a diagram showing how the probe portion is forced into a retaining portion to be retained therein;

DETAILED DESCRIPTION OF THE PREFERRED EMBODIMENTS

First Embodiment

Figure 3:
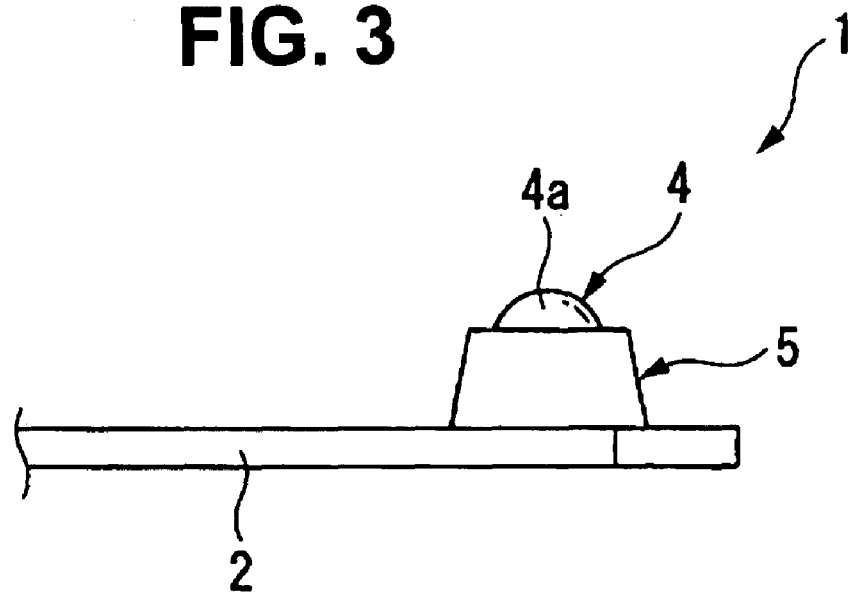
FIG. 3 is a side view of the cantilever shown in FIG. 1.

In the following, a cantilever and a cantilever manufacturing method according to the first embodiment of the present invention will be described with reference to FIGS. 1 to 6. The cantilever of this embodiment is detachably attached to a cantilever holder of a scanning probe microscope (not shown), and is used to observe the physical properties of a sample, such as viscoelasticity and frictional force.

As shown in FIG. 1 to 4, a cantilever 1 according to this embodiment has a surface opposed to the sample (not shown), and is equipped with a flat-plate-like lever portion 2 with spring property which is configured so as to extend from the proximal end to the distal end, a holder portion 3 supporting the proximal end of the lever portion 2 in an overhanging state, a probe portion 4 arranged at the distal end of the lever portion 2 so as to be capable of coming into contact with the sample and having an opposing surface 4a facing at least the sample side and formed in a spherical configuration of a predetermined radius, and a retaining portion 5 whose one end is fixed to the distal end of the lever portion 2 and which retains the probe portion 4 with the opposing surface 4a thereof exposed.

The lever portion 2 and the holder portion 3 are integrally formed of an SOI substrate formed of three layers, for example, of a silicon support layer, an oxide layer, and a silicon activator layer thermally attached to each other. In this embodiment described below, the probe portion 4 is formed in a spherical configuration of a predetermined radius. That is, the entire range of the outer surface thereof can be used as the opposing surface 4a opposed to the sample.

The retaining portion 5 is prepared by stereo lithography. It is arranged so as to surround the periphery of the probe portion 4, and has on its inner side a contact surface 5a held in contact with the outer surface of the probe portion 4. When the probe portion 4 is forced in from the other side, the probe portion 4 is retained by a surface attraction force, which is a chemical binding force directed exerted between the outer surface and the contact surface 5a. More specifically, the retaining portion 5 is formed as a cylinder at least a part of the inner peripheral surface of which constitutes the contact surface 5a.

Figure 4:
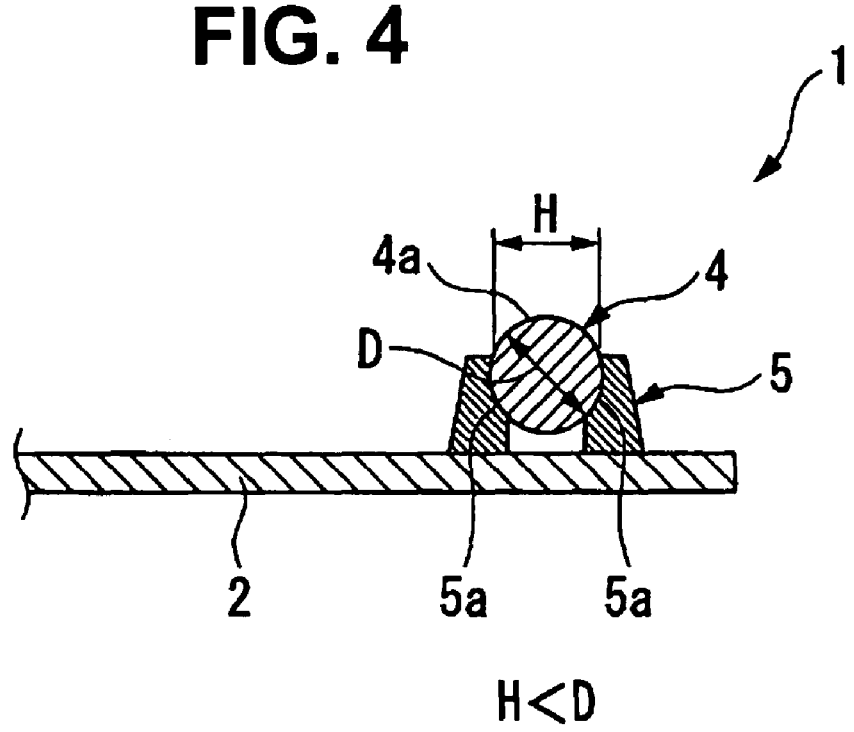
FIG. 4 is a sectional view of the cantilever shown in FIG. 1.

The method of preparing the retaining portion 5 will be described in detail below along with the method of manufacturing the cantilever 1. As shown in FIG. 4, in the retaining portion 5 of this embodiment, the size H of the opening at the other end is smaller than the diameter D of the probe portion 4.

Next, a method of manufacturing the cantilever 1, constructed as described above, will be illustrated. In this embodiment, as described below, the retaining portion 5 is prepared by stereo lithography.

In the cantilever manufacturing method of this embodiment, the following steps are performed: an immersion step in which the holder portion 3 and the lever portion 2 are, after being integrally formed, immersed in a photo-setting resin (not shown) for stereo lithography; a stereo lithography step in which, after the immersion step, a laser beam is applied to the distal end of the lever portion 2 to locally cure the portion of the photo-setting resin situated at the focus of the laser beam and in which the laser beam is moved so as to move the focal position along a desired three-dimensional pattern to successively cure the photo-setting resin to thereby prepare the retaining portion 5 by stereo lithography; a setting step in which, after the stereo lithography step, the lever portion 2 with one end of the retaining portion 5 fixed thereto and the holder portion 3 are extracted from the photo-setting resin, and in which the other end of the retaining portion 5 is placed at a position above the probe portion 4; and a retaining step in which, after the setting step, the probe portion 4 is forced into the retaining portion 5 from the other end thereof so as to expose the opposing surface 4a on the sample side and in which the probe portion 4 is retained by a surface attraction force directed exerted between the outer surface of the probe portion 4 and the contact surface 5a of the retaining portion 5. In the following, the above-mentioned steps will be described in detail.

First, using an SOI substrate, the holder portion 3 and the lever portion 2 are formed integrally by a semiconductor technique. Then, the immersion step is conducted, in which the holder portion 3 and the lever portion 2, thus formed integrally, are immersed in a photo-setting resin for stereo lithography. Next, a laser beam is applied to the distal end of the lever portion 2. As a result, the portion of the photo-setting resin situated at the focus of the laser beam starts to cure locally. In this case, the laser beam is moved so as to move the focal position along the desired three-dimensional pattern of the retaining portion 5.

As shown in FIG. 4, the focal point is moved so as to form the retaining portion 5 having on the inner side thereof the contact surface 5a in contact with the outer surface of the probe portion 4 while surrounding the periphery of the probe portion 4. More specifically, the focal point is moved so as to form the retaining portion 5 as a cylinder at least a part of the inner peripheral surface of which constitutes the contact surface 5a and the size H of the opening at the other end of which is smaller than the diameter D of the probe portion 4.

The photo-setting resin, which is cured successively, along the locus of the focal position, is formed into the above-described configuration. By this stereo lithography step, it is possible to prepare the retaining portion 5 whose one end is fixed to the distal end of the lever portion 2. Then, the lever portion 2 with the retaining portion 5 formed at the distal end thereof and the retaining portion are extracted from the photo-setting resin. Next, there is conducted the setting step in which the other end of the retaining portion 5 is situated at a position over the probe portion 4.

In the following, the setting step will be described in detail.

Figure 5A:
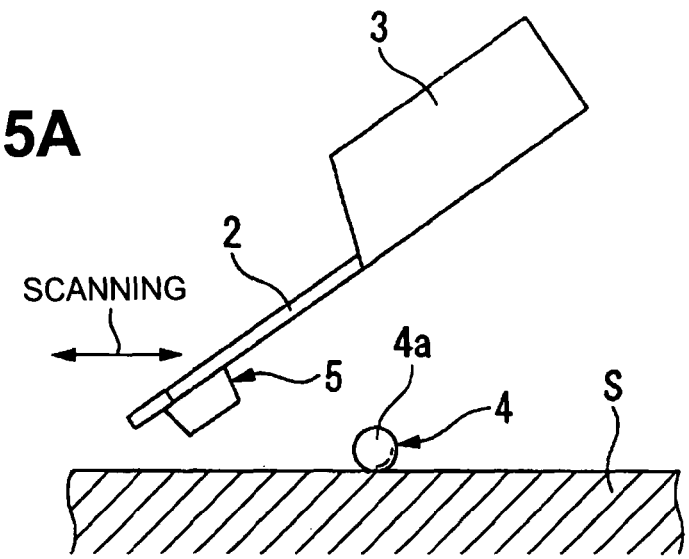
Figure 5B:
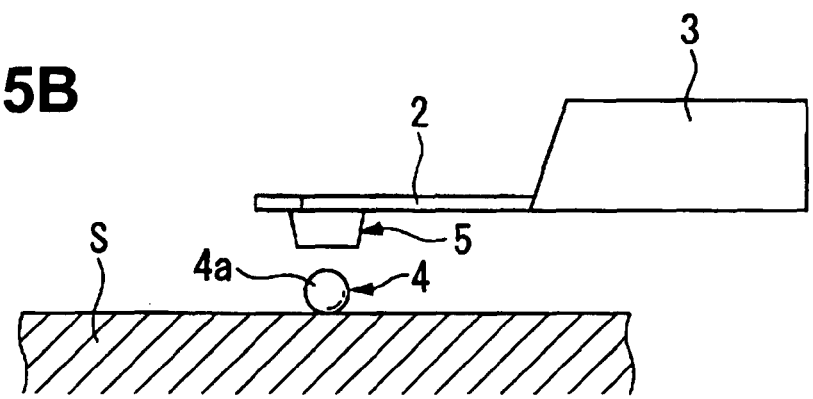

First, as shown in FIG. 5A, there is conducted the placing step, in which the probe portion 4 is placed on the substrate S. After the placing step, there is conducted the locating step, in which scanning is performed on the substrate S with the probe portion 4 placed thereon by the lever portion 2 to perform SPM observation on the surface configuration of the probe portion 4 and to locate the position of the probe portion 4. This locating step is conducted with the lever portion 2 set on the scanning probe microscope (not shown) through the intermediation of the holder portion 3. Through this locating step, it is possible to check the surface configuration of the probe portion 4 and to clearly locate the position of the probe portion 4. After that, as shown in FIG. 5B, the lever portion 2 is moved to a position over the probe portion 4 whose position has been located, and the other end of the retaining portion 5 is situated above the probe portion 4, whereby the setting step is completed.

Figure 5C:
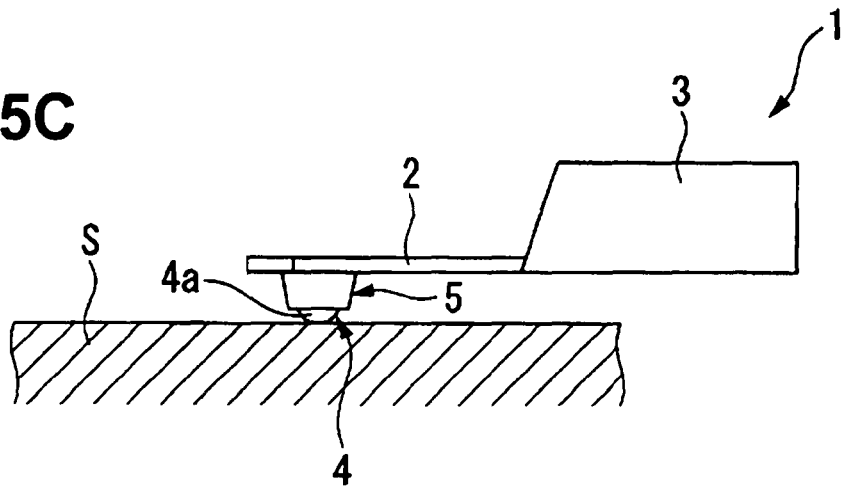
Figure 6:
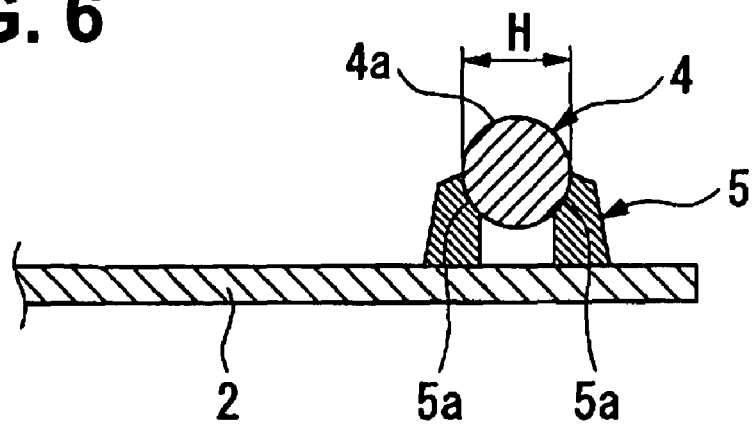
FIG. 6 is a sectional view of the probe portion forced into the retaining portion.

After the completion of the setting step, there is conducted the retaining step, in which the lever portion 2 and the probe portion 4 are moved relative to each other so as to approach each other and in which, as shown in FIG. 5C, the probe portion 4 is forced into the retaining portion 5 from the other end thereof. The opening size H of the other end of the retaining portion 5 is smaller than the diameter D of the probe portion 4, so, as shown in FIG. 6, the retaining portion 5 undergoes deformation as the probe portion 4 is forced in, and the opening size H is enlarged. When the probe portion 4 has been forced in, the retaining portion 5 is restored to the former state due its own elasticity, and the outer surface of the probe portion 4 and the contact surface 5a of the retaining portion 5 are brought into intimate and complete face contact with each other. The retaining portion 5 can retain the probe portion 4 because of the chemical binding force at the time of this intimate contact, that is, the surface attraction force. In this way, the cantilever 1 can be manufactured.

In particular, the retaining portion 5 is formed so as to surround the periphery of the probe portion 4, so the retaining portion 5 can firmly retain the probe portion 4 through multi-point grasp. Further, since the retaining portion 5 is cylindrical, the contact surface 5a and the outer surface of the probe portion 4 are held in contact over the entire periphery of the probe portion 4; whereby it is possible to retain the probe portion 4 more reliably.

Further, since the size H of the opening at the other end is smaller than the diameter D of the probe portion 4, the contact surface 5a exerts a "rebound" action when the probe portion 4 is forced in. Thus, the probe portion 4 is stabilized in posture and retained more reliably. Further, since the opening size H is smaller than the diameter D, it is possible to obtain, in addition to the surface attraction force, a binding force due to physical fit-engagement. This also helps to enhance the reliability in retention.

In this manner, the probe portion 4 is retained by the retaining portion 5 with the spherical opposing surface 4a of a predetermined diameter exposed from the retaining portion 5 so as to be opposed to the sample. Thus, it is possible to keep the contact area between the sample and the probe at a known value, making it possible to accurately observe the physical properties of the sample, such as viscoelasticity and frictional force.

In particular, in the cantilever manufacturing method of this embodiment, the probe portion 4 is forced into the retaining portion 5, and is retained by the surface attraction force directly exerted between the outer surface of the probe portion 4 and the contact surface 5a, so there is no need to use adhesive as in the prior art. Thus, there is no need to apply adhesive with pinpoint accuracy to a predetermined position at the distal end of the lever portion 2, nor is it necessary to quickly bond the probe portion 4 in consideration of the curing time of the adhesive. Thus, the mounting operation ceases to be one requiring skilled labor, making it possible to reduce the requisite time and effort on the part of the operator and to shorten the operation time.

Further, since the probe portion 4 is forced into the retaining portion 5 whose one end is fixed to the lever portion 2, the probe portion 4 can be retained reliably at the correct position. In the prior art, adhesion is effected the instant the spherical body comes into contact with the region to which adhesive has been applied. Thus, it is necessary to apply a predetermined amount of adhesive exclusively to the intended position, and to accurately manipulate the spherical body to that position.

In contrast, in the cantilever 1 manufacturing method of this embodiment, the probe portion 4 is forced into the retaining portion 5 fixed to the lever portion 2, and can be retained therein without using any adhesive, so it is possible to accurately retain the probe portion 4 at the intended position. This also helps to facilitate the operation for the operator, and to attain an improvement in product quality.

Further, since no adhesive is used, there is no fear of surplus adhesive reaching the probe portion 4 to cover the surface thereof. Thus, when the opposing surface 4a of the probe portion 4 exposed from the retaining portion 5 comes into contact with the sample, no change occurs in the contact area therebetween. This also helps to achieve an improvement in product quality. Further, since the retaining portion 5 is prepared by stereo lithography, the retaining portion 5 can be easily prepared even when it is of a configuration difficult to form by an ordinary method, thus providing a high degree of freedom in terms of design.

As stated above, in the cantilever 1 and the cantilever 1 manufacturing method of this embodiment, the probe portion 4 can be mounted in a short time without using any adhesive, making it possible to achieve an improvement in product quality. Further, SPM observation is conducted when fixing the probe portion 4, so even a probe portion so small as to be difficult to observe with a conventional optical microscope can be reliably forced into the retaining portion 5 for fixation. Thus, it is possible to manufacture a cantilever 1 having a smaller probe portion 4, making it possible to observe the minute region of the sample with high resolution.

In the first embodiment described above, it is possible to conduct, prior to the setting step, a modifying step, in which the probe portion 4 is previously modified with a predetermined substance.

By performing this modifying step, it is possible to modify the probe portion 4 beforehand with various substances according to the object in observing the sample. In particular, as stated above, the probe portion 4 can be fixed in position by the simple operation of forcing in without using any adhesive, there is no fear of the modified portion being flawed or affected by adhesive as in the prior art. Thus, it is not necessary to perform modification on the probe portion 4 together with the cantilever 1.

Thus, it is possible to prevent the cantilever 1 from being adversely affected, and to perform modification without involving any limitation in terms of the kind of substance used. As a result, it is possible to perform a more diversified observation, and to achieve an improvement in degree of freedom in terms of the design of the cantilever 1.

Figure 7:
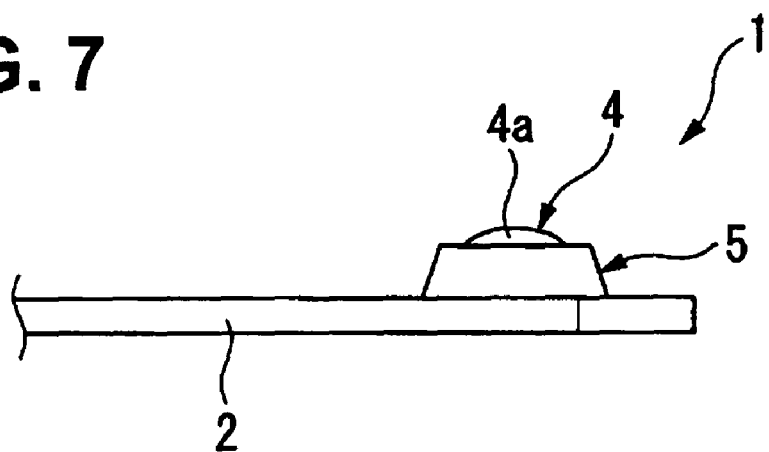
FIG. 7 is a side view of a modification of the first embodiment of the present invention, showing a cantilever having a probe portion of an elliptical sectional configuration.
Figure 8:
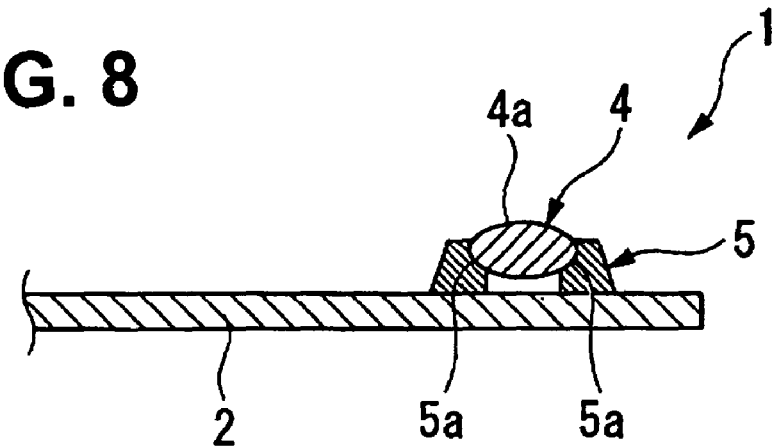
FIG. 8 is a sectional view of the cantilever shown in FIG. 7.

While in the first embodiment described above the probe portion 4 is of a perfectly spherical configuration, this should not be construed restrictively. It is only necessary for at least the opposing surface 4a, exposed from the retaining portion 5 and opposed to the sample, to be formed in aspherical configuration. For example, as shown in FIGS. 7 and 8, it is also possible to adopt a probe portion 4 of an elliptical sectional configuration or of a semi-spherical configuration of which solely the exposed surface is spherical.

Second Embodiment

Next, a cantilever and a cantilever manufacturing method according to the second embodiment of the present invention will be described with reference to FIGS. 9 to 11. In the second embodiment, the components that are the same as those of the first embodiment are indicated by the same reference numerals, and a description thereof will be omitted.

Figure 9:
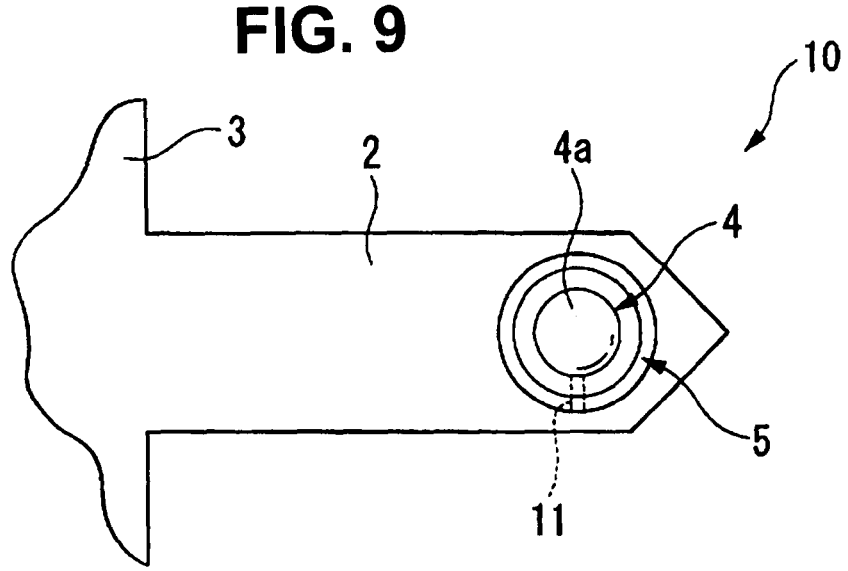
FIG. 9 is a top view of a cantilever according to a second embodiment of the present invention.
Figure 10:
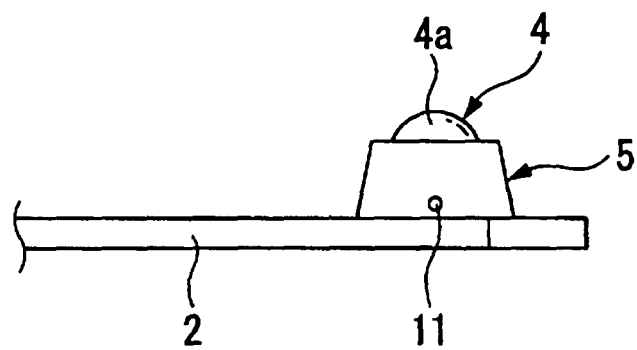
FIG. 10 is a side view of the cantilever shown in FIG. 9.
Figure 11:
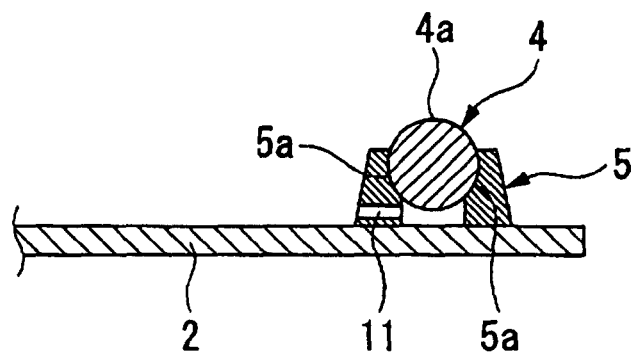
FIG. 11 is a sectional view of the cantilever shown in FIG. 9.

As shown in FIGS. 9 to 11, in a cantilever 10 according to this embodiment, the cylindrical retaining portion 5 has a communication hole 11 establishing communication between the interior and the exterior of the retaining portion 5 and making it possible to discharge to the exterior the inner fluid compressed by the probe portion 4 when the probe portion 4 is forced into the retaining portion 5. As shown in FIG. 10, in this embodiment, the communication hole 11 has a circular sectional configuration, and provided only one in number in the vicinity of one end of the retaining portion 5.

To form the communication hole 11, the focal position of the laser beam is moved three-dimensionally during the stereo lithography process taking into account the communication hole 11 in advance.

In the cantilever 10 and the cantilever 10 manufacturing method of this embodiment, due to the formation of the communication hole 11, it is possible to discharge to the exterior a fluid, such as air or solution, compressed in the retaining portion 5 by the probe portion 4 during the retaining step, in which the probe portion 4 is forced into the retaining portion 5 for fixation. Thus, the probe portion 4 can be easily forced into the retaining portion 5, thereby achieving an improvement in terms of operational efficiency.

Figure 12:
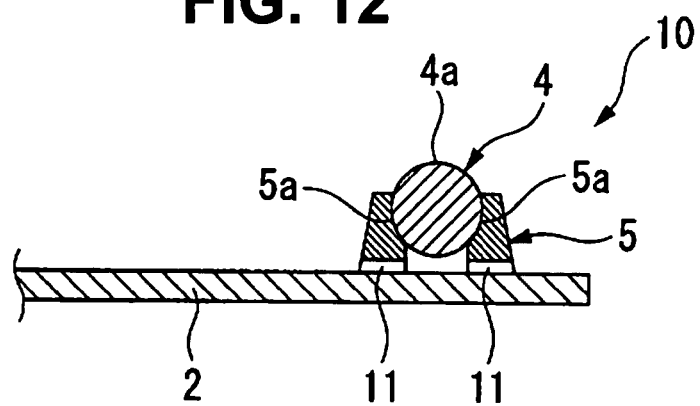
FIG. 12 is a sectional view of a modification of the second embodiment of the present invention, showing a cantilever with a communication hole formed so as to be situated on a surface of a lever portion.
Figure 13:
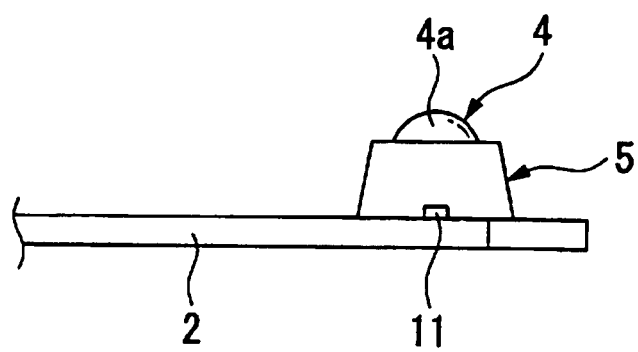
FIG. 13 is a side view of the cantilever shown in FIG. 12.

While in this embodiment only one communication hole 11 is formed, this should not be construed restrictively, and it is also possible to form a plurality of communication holes. Further, the sectional configuration, position, etc. of the communication hole 11 are not restricted to the ones described above, and they may be determined freely. For example, as shown in FIGS. 12 and 13, it is also possible to form the communication hole 11 so as to provide an escape way for the fluid on the surface of the lever portion 2. In this case, as shown in FIG. 13, the sectional configuration of the communication hole 11 may be rectangular.

Further, instead of forming the communication hole 11 in the retaining portion 5, it is also possible to form the communication hole 11 in the lever portion 2 so as to substantially position the communication hole 11 directly below the probe portion 4. In this case also, the same effect as that of the above-described embodiment can be obtained.

Third Embodiment

Next, a cantilever and a cantilever manufacturing method according to the third embodiment of the present invention will be described with reference to FIGS. 14 and 15. In the third embodiment, the components that are the same as those of the first embodiment are indicated by the same reference numerals, and a description thereof will be omitted.

Figure 14:
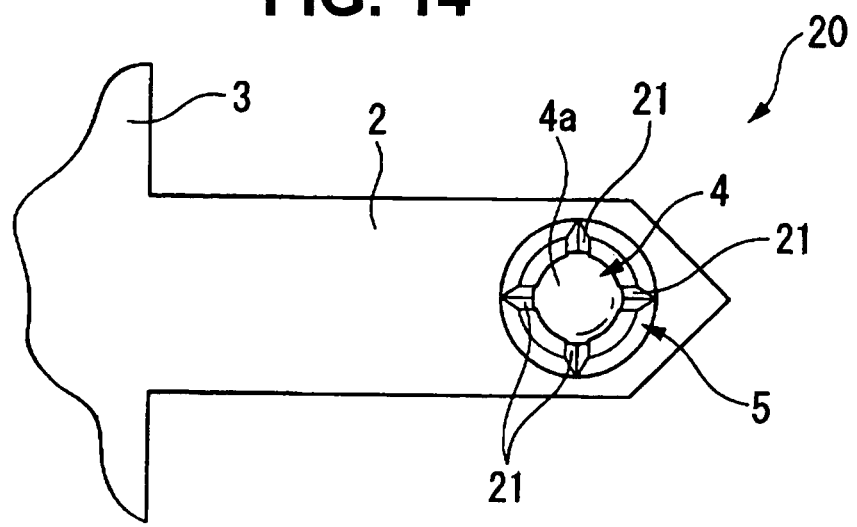
FIG. 14 is a top view of a cantilever according to a third embodiment of the present invention.
Figure 15:
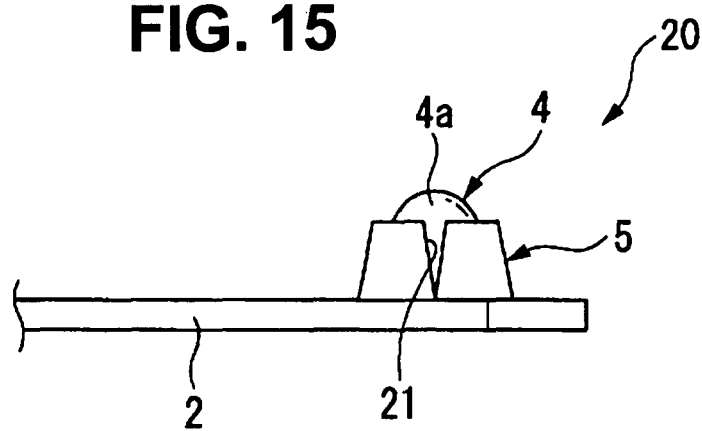
FIG. 15 is a side view of the cantilever shown in FIG. 12.

As show in FIGS. 14 and 15, in a cantilever 20 according to this embodiment, the retaining portion 5 has a plurality of slits 21 formed at predetermined circumferential intervals. In this embodiment, there are four slits 21 arranged at an interval of 90 degrees.

To form the slits 21, the focal position of the laser beam is moved three-dimensionally during the stereo lithography step taking into account the slits 21 in advance.

In the cantilever 20 and the cantilever 20 manufacturing method of this embodiment, four slits 21 are formed at circumferential intervals, so the retaining portion 5 easily undergoes radial expansion and contraction. That is, the retaining portion 5 easily undergoes an increase or a decrease in diameter. Thus, the probe portion 4 can be forced into the retaining portion 5 more easily, thus achieving an improvement in terms of operational efficiency.

While in this embodiment four slits 21 are formed, this should not construed restrictively, and the number of slits 21 may also be three, five, etc.

Forth Embodiment

Next, a cantilever and a cantilever manufacturing method according to the fourth embodiment of the present invention will be described with reference to FIGS. 16 to 18. In the fourth embodiment, the components that are the same as those of the first embodiment are indicated by the same reference numerals, and a description thereof will be omitted.

Figure 16:
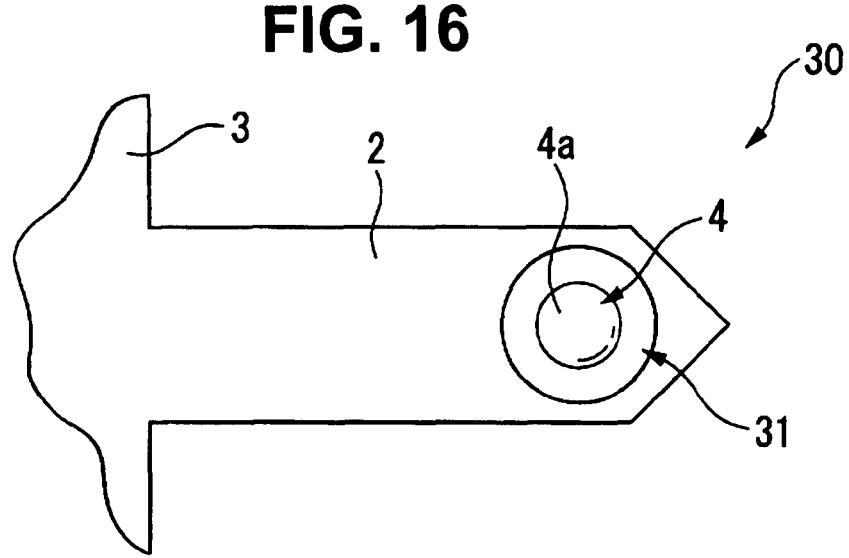
FIG. 16 is a top view of a cantilever according to a fourth embodiment of the present invention.
Figure 17:
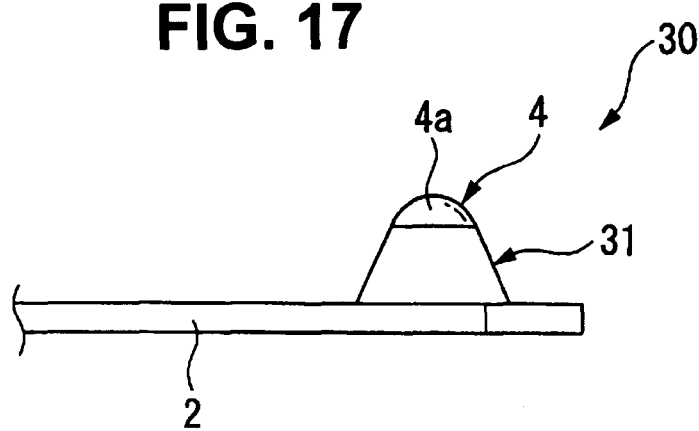
FIG. 17 is a side view of the cantilever shown in FIG. 16.
Figure 18:
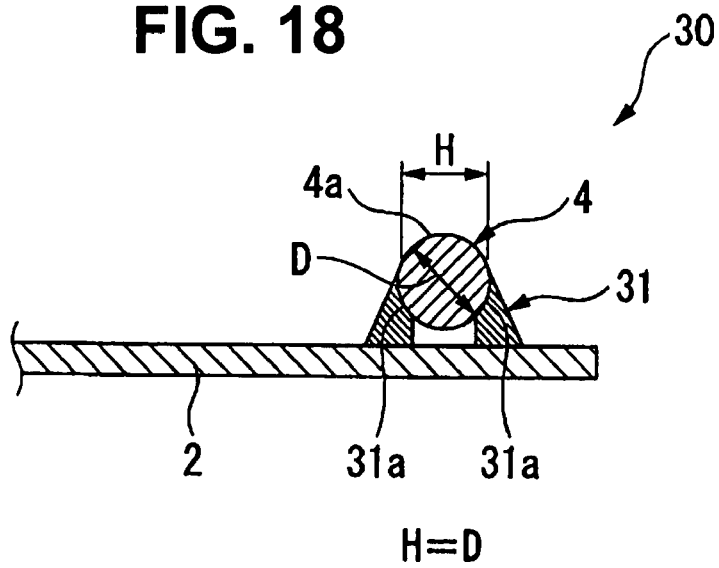
FIG. 18 is a sectional view of the cantilever shown in FIG. 16.

As shown in FIGS. 16 to 18, in a cantilever 30 according to this embodiment, the opening at the other end of a retaining portion 31 is, unlike that of the retaining portion 5 of the first embodiment, formed during the stereo lithography step such that the size H thereof is substantially the same as the diameter D of the probe portion 4.

Also in this cantilever 30 with the retaining portion 31 prepared as described above, when the probe portion 4 is forced into the retaining portion 31 for fixation, the outer surface of the probe portion 4 and the contact surface 31a are directly brought into intimate contact with each other by a surface attraction force, which is a chemical binding force, so it is possible to retain the probe portion 4 reliably. In particular, since the size H of the opening at the other end is approximately the same as the diameter D of the probe portion 4, there is no need to force in the probe portion 4 with excessive force, thus enabling the probe portion 4 to be retained easily. The smaller the size of the probe portion 4, the more markedly exerted is the surface attraction force (attraction energy) as compared with the self weight, so it is possible to retain the probe portion 4 more reliably.

Figure 19:
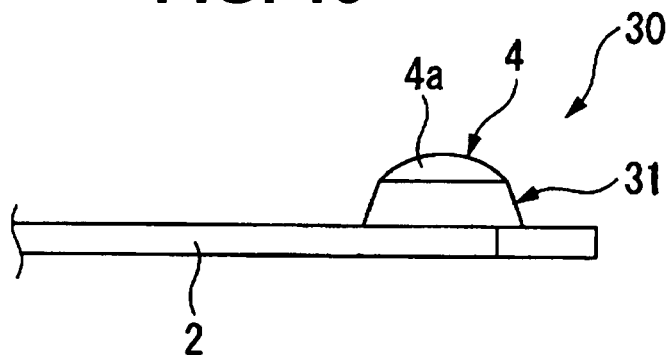
FIG. 19 is a side view of a modification of a fourth embodiment of the present invention, showing a cantilever with a probe portion of an elliptical sectional configuration.
Figure 20:
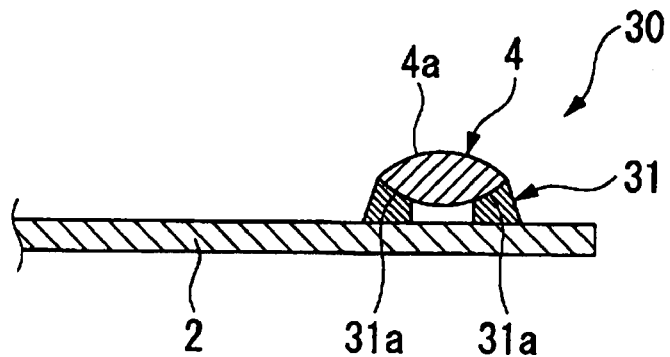
FIG. 20 is a sectional view of the cantilever shown in FIG. 19.

As in the first embodiment, in this embodiment also, the configuration of the probe portion 4 is not restricted to a perfectly spherical one. For example, as shown in FIGS. 19 and 20, the probe portion 4 may assume an elliptical sectional configuration or a semi-spherical configuration in which exclusively the exposed surface is spherical.

Fifth Embodiment

Next, a cantilever and a cantilever manufacturing method according to the fifth embodiment of the present invention will be described with reference to FIGS. 21 and 22. In the fifth embodiment, the components that are the same as those of the first embodiment are indicated by the same reference numerals, and a description thereof will be omitted.

While in the first embodiment the size H of the opening at the other end of the retaining portion 5 is a fixed value smaller than the diameter D of the probe portion 4, in the fifth embodiment, the size H of the opening at the other end of the retaining portion 5 is variable.

Figure 21:
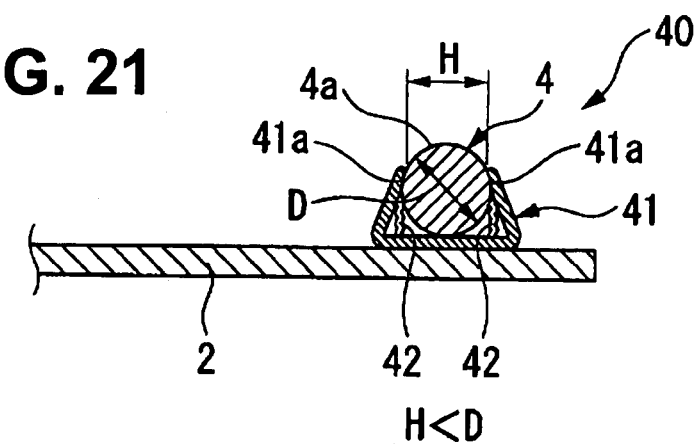
FIG. 21 is a sectional view of a cantilever according to a fifth embodiment of the present invention.

As shown in FIG. 21, in a cantilever 40 according to this embodiment, a part of a retaining portion 41 constitutes a variable portion 42 formed of a shape-memory material which is expanded and contracted by external factors. At the same time, as the variable portion expands/contracts, the size H of the opening at the other end is varied so as to become larger than the diameter D of the probe portion 4, thus, making the probe portion 4 detachable.

Figure 22:
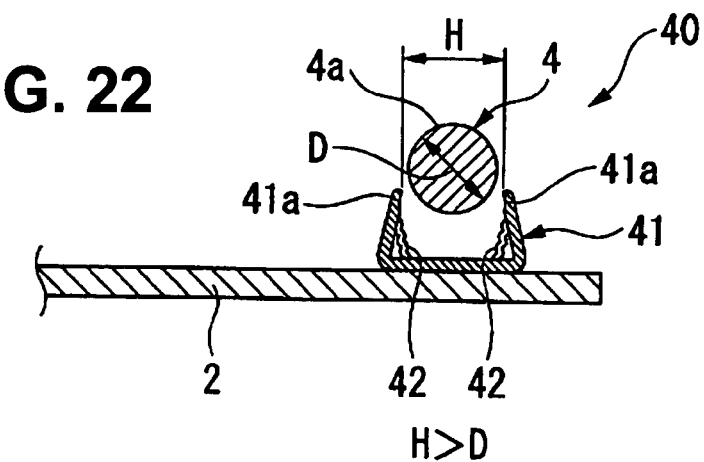
FIG. 22 is a side view showing how ambient temperature is raised to expand a variable portion, making an opening size at the other end larger than a diameter of the probe portion.

When the ambient temperature, which is an example of the external factors, becomes higher than room temperature (which is substantially 23 degrees), the variable portion 42 expands as shown in FIG. 22. As a result, the size H of the opening at the other end becomes larger than the diameter D of the probe portion 4. When the ambient temperature becomes lower than room temperature, the variable portion 42 contracts as shown in FIG. 21, making the opening size H smaller than the diameter D of the probe portion 4.

To prepare the cantilever 40, when conducting the stereo lithography step, the portion other than the variable portion 42 is temporarily prepared and is then changed to a shape-memory material as a photo-setting resin. Then, a laser beam is applied to exclusively prepare the variable portion 42.

In the cantilever 40, constructed as described above, the probe portion 4 can be detached from the retaining portion 41, so it is possible to replace exclusively the probe portion 4 upon secular changes, etc. Thus, it is possible to minimize the number of components to be replaced, thereby achieving a reduction in running cost.

Further, when the probe portion 4 is brought into contact with the sample, it is possible to cause some object to be measured (e.g., DNA) to adhere to the probe portion 4, and to detach the probe portion 4 with the object to be measured adhering thereto, sending the object to be measured to places for other inspections, observations, etc. together with the probe portion 4.

Apart from temperature, the variable portion 42 may also be expanded and contracted by some other external factor, such as electric field or magnetic field.

Sixth Embodiment

Next, a cantilever and a cantilever manufacturing method according to the sixth embodiment of the present invention will be described with reference to FIGS. 23 and 24. In the sixth embodiment, the components that are the same as those of the first embodiment are indicated by the same reference numerals, and a description thereof will be omitted.

While the retaining portion 5 of the first embodiment is formed as a cylinder, the retaining portion of a cantilever 50 according to the fifth embodiment is prepared as a plurality of claw portions 51.

Figure 23:
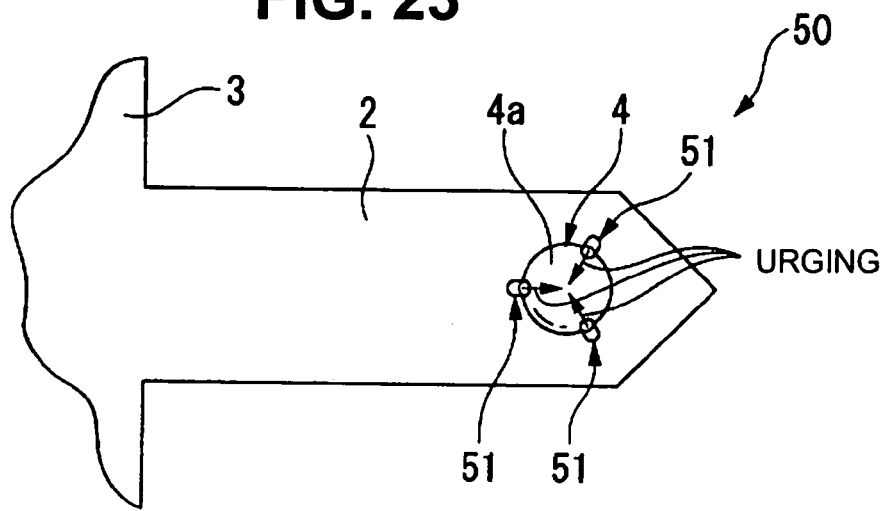
FIG. 23 is a top view of a cantilever according to a sixth embodiment of the present invention.
Figure 24:
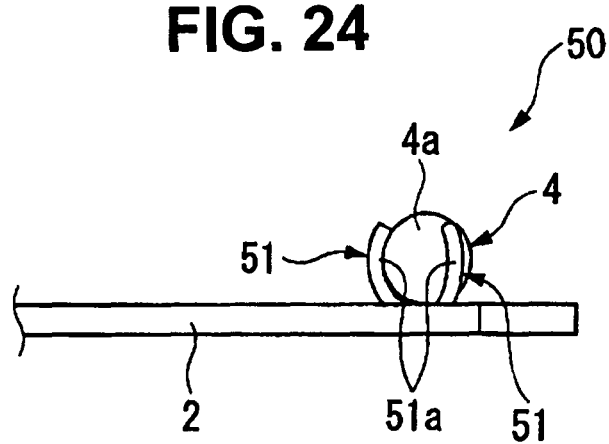
FIG. 24 is a side view of the cantilever shown in FIG. 23.

As shown in FIG. 23, the cantilever 50 of this embodiment has a plurality of claw portions 51 (retaining portion) surrounding the periphery of the probe portion 4 at predetermined intervals and each having a contact surface 51a on the inner side thereof. In this embodiment, the number of claw portions 51 is three, and they are formed at an interval of 120 degrees. Further, in this embodiment, the three claw portions 51 are formed such that they are previously urged so as to be deflected toward the center of the probe portion 4.

To form the claw portions 51, the focal position of a laser beam is moved three-dimensionally along the configuration of the three claw portions 51.

In the cantilever 50 and the cantilever 50 manufacturing method of this embodiment, the retaining portion is formed by the three claw portions 51, so it is possible to reliably surround the periphery of the probe portion 4 and to retain the probe portion 4 in an embracing manner. Thus, it is possible to reliably retain the probe portion 4. In particular, the three claw portions 51 are urged beforehand toward the center of the probe portion 4, so it is possible to augment the surface attraction force directly exerted between the outer surface of the probe portion 4 and the contact surfaces 51a. Thus, it is possible to retain the probe portion 4 with a stronger force. Further, it is possible to easily check through the clearances between the claw portions 51 how the probe portion 4 is retained.

Figure 25:
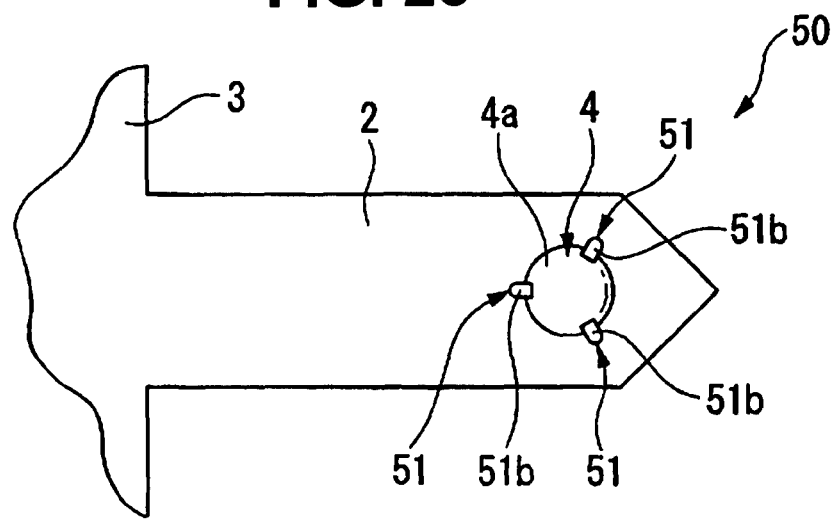
FIG. 25 is a top view of a modification of the sixth embodiment of the present invention, showing a cantilever equipped with a plurality of straight claw portions with turn-up portions at the other ends.
Figure 26:
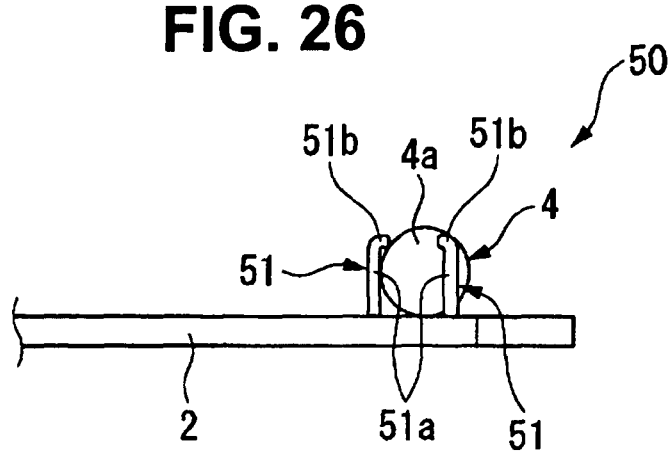
FIG. 26 is a side view of the cantilever shown in FIG. 25.

While in this embodiment the three claw portions 51 are formed so as to be previously urged toward the center of the probe portion 4, this should not be construed restrictively. For example, as shown in FIGS. 25 and 26, they may also be formed straight. In this case, as shown in FIG. 26, it is advisable to form hook-like turn-up portions 51b at the other end of the cantilever 50.

Due to this construction, the probe portion 4, retained by the three claw portions 51 in an embracing manner, are held in contact with the turn-up portions 51b, so it does not easily undergo positional deviation. Thus, the probe portion 4 is more stabilized in posture and is not easily detached. As a result, the probe portion 4 can be retained more reliably.

Seventh Embodiment

Next, a cantilever and a cantilever manufacturing method according to the seventh embodiment of the present invention will be described with reference to FIGS. 27 to 29. In the seventh embodiment, the components that are the same as those of the first embodiment are indicated by the same reference numerals, and a description thereof will be omitted.

While in the first embodiment the probe portion 4 is forced into the retaining portion 5 and is retained by the surface attraction force directly exerted between the outer surface of the probe portion 4 and the contact surface 5a, in the seventh embodiment, the probe portion 4 is attracted for fixation by utilizing a magnetic force.

Figure 27:
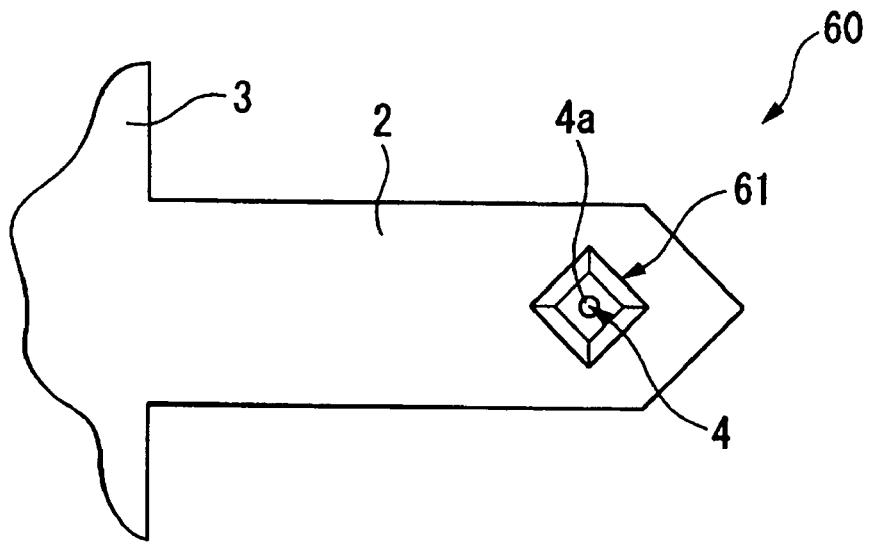
FIG. 27 is a top view of a cantilever according to a seventh embodiment of the present invention.
Figure 28:
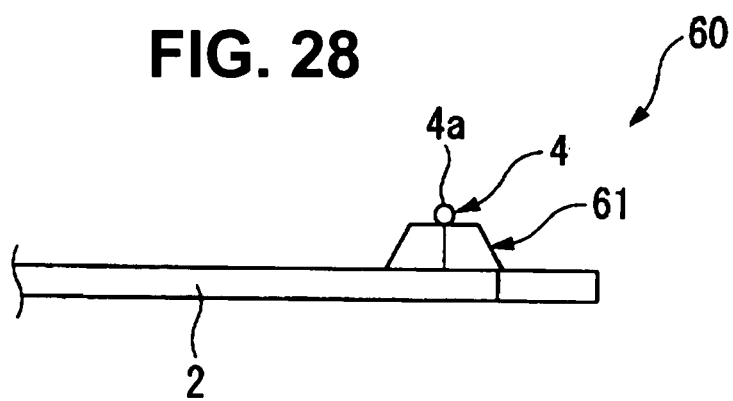
FIG. 28 is a side view of the cantilever shown in FIG. 27.

As shown in FIGS. 27 and 28, a cantilever 60 according to this embodiment is equipped with the lever portion 2, the holder portion 3, the probe portion 4 formed of a magnetic material, and a magnetic body (attracting portion) 61 provided on the front surface of the distal end of the lever portion 2 and adapted to attract the probe portion 4 to its own surface. The magnetic body 61 is formed of, for example, of a magnet or an object covered with a thin magnetic film.

Figure 29:
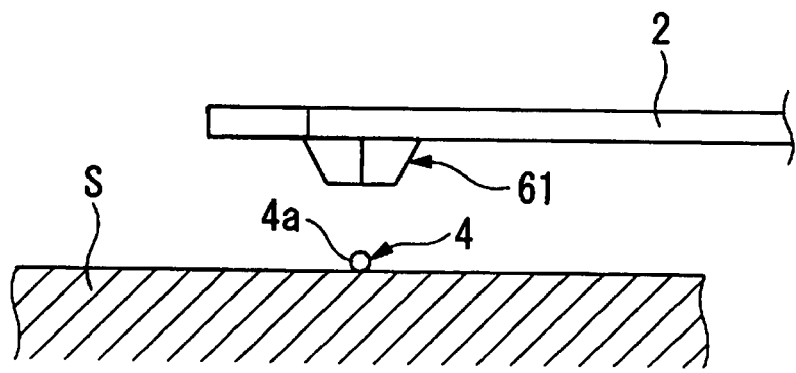
FIG. 29 is a diagram illustrating a process of manufacturing the cantilever shown in FIG. 27, showing how the lever portion is moved to a position over the probe portion whose position has been located through SPM observation.

In the method of manufacturing the cantilever 60 of this embodiment, there are conducted a placing step in which the holder portion 3 and the lever portion 2 are integrally formed of an SOI substrate S and in which, after mounting the magnetic body 61 to the distal end of the lever portion 2, the probe portion 4 formed of a magnetic body is placed on the substrate S, a locating step in which, after the placing step, scanning is performed on the substrate S with the lever portion 2 as in the first embodiment to observe the surface configuration of the probe portion 4 with an SPM and to locate the position of the probe portion 4, a setting step in which, as shown in FIG. 29, the magnetic body 61 mounted to the distal end of the lever portion 2 is placed at a position over the probe portion 4 whose position has been located, and a fixing step in which, after the setting step, the magnetic body 61 and the probe portion 4 are brought close to each other and in which the probe portion 4 is caused to be attracted for fixation to the magnetic body 61 at the distal end of the lever portion 2.

As in the first embodiment, in this embodiment also, it is possible to mount the probe portion 4 without using any adhesive, and to obtain the same effect as that in the first embodiment. Further, since the probe portion 4 is mounted after SPM observation, even a probe portion 4 so small as to be difficult to observe with a conventional optical microscope can be reliably fixed in position. In particular, due to the use of the magnetic force, the probe portion 4 can be fixed in position easily and instantaneously.

Figure 30:
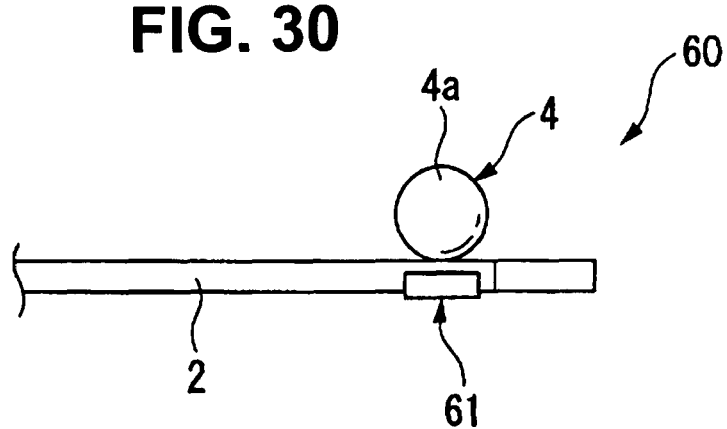
FIG. 30 is a side view of a modification of the seventh embodiment of the present invention, showing a cantilever having a magnet mounted to a back surface of the lever portion thereof.
Figure 31:
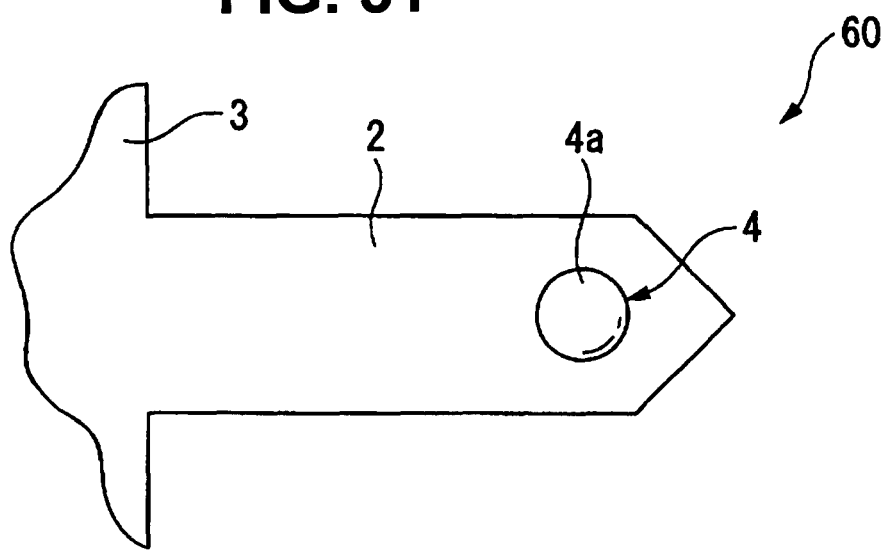
FIG. 31 is a top view of the cantilever shown in FIG. 30.

While in this embodiment the magnetic body 61 is mounted to the front surface of the lever portion 2, it may also be mounted to the back surface of the lever portion 2 as shown in FIGS. 30 and 31.

Further, it is also possible for the probe portion 4 itself to be formed of a magnet. This helps to further enhance the attraction force, making it possible to fix the probe portion 4 in position more reliably.

Further, it is also possible to form the probe portion 4 of a magnet, and to mount to the lever portion 2 the magnetic body to which the probe portion 4 is attracted. It is also possible to provide a magnetic film at a predetermined position on the front or the back surface of the lever portion 2. In any of those cases, it is possible to fix the probe portion 4 in position by utilizing a magnetic force.

Figure 32:
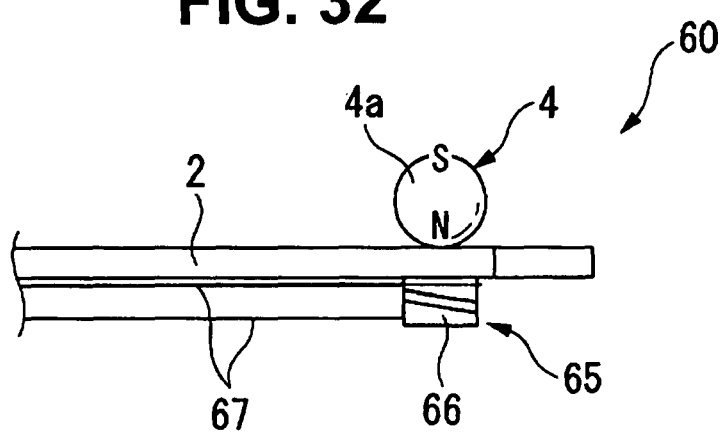
FIG. 32 is a side view of a modification of the seventh embodiment of the present invention, showing a cantilever having an electromagnet mounted to a back surface of the lever portion thereof.
Figure 33:
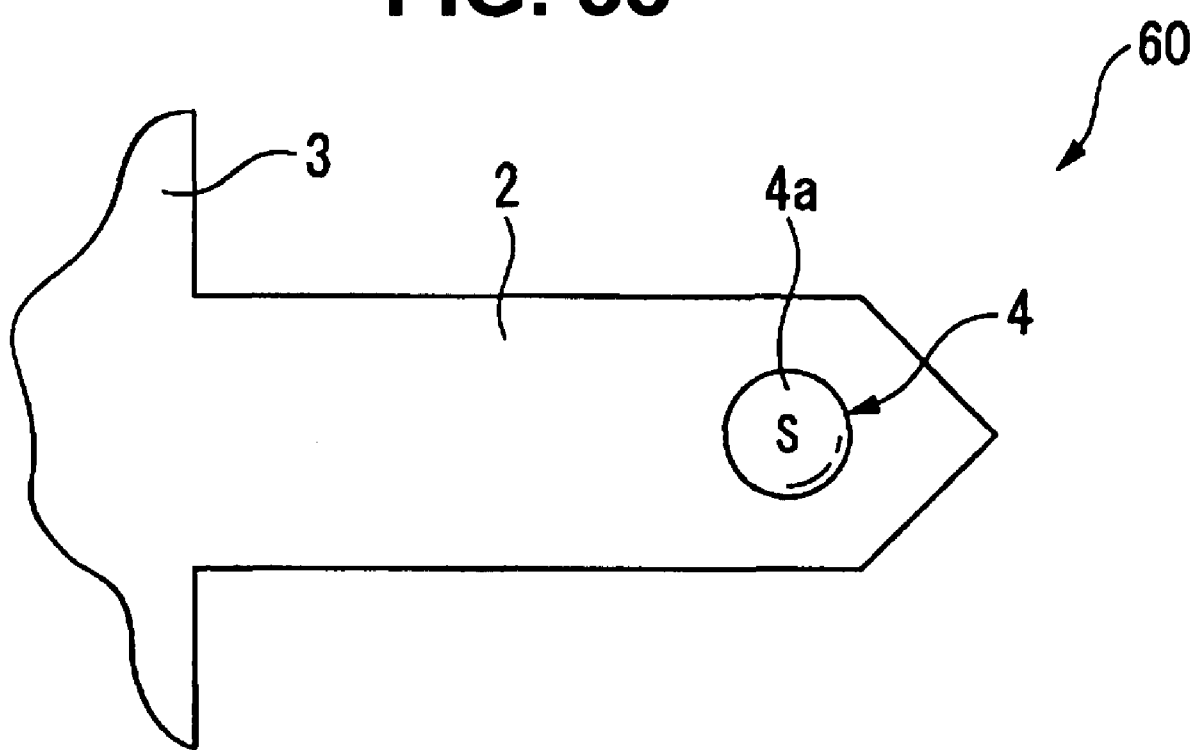
FIG. 33 is a top view of the cantilever shown in FIG. 32.

Further, as shown in FIGS. 32 and 33, it is also possible to form the probe portion 4 of a magnet, and to mount an electromagnet (attracting portion) 65 to the lever portion 2. The electromagnet 65 is composed of a core 66 fixed to the back surface of the lever portion 2, and a coil 67 wound around the core 66.

By thus mounting the electromagnet 65, it is possible to detach the probe portion 4 from the lever portion 2 through reversal of polarity (N-pole, S-pole). Thus, it is possible to replace exclusively the probe portion 4, and to cause an object to be measured, such as DNA, to adhere to the probe portion 4, sending the object to be measured to places for other inspections, observations, etc. together with the probe portion 4.

In the seventh embodiment described above, it is possible to perform, prior to the placing step for placing the probe portion 4 on the substrate S, a modifying step in which the probe portion 4 is previously modified with a predetermined substance. In particular, since the probe portion 4 is fixed in position by a magnetic force without using any adhesive, there is no fear of the modified portion being flawed or affected by adhesive. Thus, it is not necessary to perform modification on the probe portion together with the cantilever 60. Thus, it is possible to prevent the cantilever 60 from being adversely affected, and to perform modification without being restricted in terms of the kind of substance used. As a result, it is possible to perform a more diversified observation, and to achieve an improvement in terms of a degree of freedom in the design of the cantilever 60.

Further, while in the seventh embodiment the probe portion 4 is fixed to the lever portion 2 without using any adhesive through attraction utilizing a magnetic force after locating the probe portion 4 through SPM observation on the substrate S, the probe portion 4 may also be fixed in position by some other method. For example, after the locating step for locating the position of the probe portion 4, it is possible to perform a fixing step in which the lever portion 2 is caused to make ultrasonic oscillation and in which the probe portion 4 is fixed in position through heat bonding by utilizing the heat generated by the ultrasonic oscillation.

In this case also, it is possible to fix in position a probe portion 4 so small as to be difficult to observe with a conventional optical microscope without using any adhesive. Thus, it is possible to obtain the same effect as that in the seventh embodiment described above.

The technical scope of the present invention is not restricted to the above-described embodiments but allows various modifications without departing from the gist of the present invention.

For example, while in the first to sixth embodiments the retaining portion is prepared by stereo lithography, this should not be construed restrictively. For example, when forming the lever portion and the holder portion integrally of an SOI substrate by an ordinary semiconductor process, it is also possible to prepare the retaining portion simultaneously. However, as stated above, adoption of stereo lithography is more preferable since it allows easy preparation of a complicated configuration difficult to shape even by a semiconductor process.

Further, while in the above-described embodiments the lever portion is formed in a flat-plate-like configuration, this should not be construed restrictively; the lever portion may be of any configuration as long as it provides spring property. For example, it may also be of a semi-cylindrical configuration with a semi-spherical section, a spindle-shaped configuration, or a columnar configuration.

What is claimed is:

1. A cantilever, comprising:
   a lever portion with spring property extending in one direction from a proximal end of the lever portion to a distal end thereof;
   a holder portion supporting the proximal end of the lever portion in an overhanging manner;
   a probe portion arranged at the distal end of the lever portion and capable of coming into contact with a sample during use of the cantilever, the probe portion having an opposing surface that faces the sample and that has a spherical configuration of a predetermined radius; and
   a retaining portion having one end fixed to the distal end of the lever portion and which retains the probe portion with the opposing surface exposed,
   wherein the retaining portion is formed as a cylinder at least a part of an inner peripheral surface of which constitutes the contact surface, the retaining portion has at another end thereof an opening of a size equal to or smaller than a diameter of the probe portion, and the retaining portion has on an inner side thereof a contact surface held in contact with an outer surface of the probe portion and surrounding a periphery of the probe portion, and
   wherein the probe portion is retained by a chemical binding force directly exerted between the contact surface and the outer surface.

2. A cantilever according to claim 1; wherein at least one of the retaining portion and the lever portion is provided with a communication hole formed therein for establishing communication between an interior and an exterior of the cylinder and allowing a compressed inner fluid to be discharged to the exterior when the probe portion is inserted.

3. A cantilever according to claim 1; wherein the retaining portion has a plurality of slits formed in a circumferential direction of the retaining portion.

4. A cantilever for a scanning probe apparatus, the cantilever comprising:
   a lever portion having opposed proximal and distal ends;
   a holding portion that holds and supports the proximal end of the lever portion;
   a probe portion at least a part of which has a spherical shape; and
   a retaining portion that retains the probe portion at the distal end of the lever portion, without use of adhesive, with the spherical-shaped part exposed,
   wherein the retaining portion has a tubular shape, and the probe portion is partly inserted inside the tubular-shaped retaining portion in direct contact therewith,
   and wherein at least one of the retaining portion and the lever portion has one or more holes that communicate the inside of the tubular-shaped retaining portion, in the region beneath the probe portion, with outside the retaining portion.

5. A cantilever according to claim 4; wherein the retaining portion completely surrounds a major part of the probe portion.

6. A cantilever according to claim 4; wherein the retaining portion retains the probe portion by a chemical binding force directly exerted between contacting surfaces of the retaining and probe portions.

7. A cantilever according to claim 4; wherein the retaining portion has a recess in which the probe portion is inserted with the spherical-shaped part exposed.

* * * * *